(12) United States Patent
Van Gemert et al.

(10) Patent No.: US 10,613,136 B2
(45) Date of Patent: Apr. 7, 2020

(54) APPARATUS COMPRISING A SEMICONDUCTOR ARRANGEMENT

(71) Applicant: NXP B.V., Eindhoven (NL)

(72) Inventors: Leo Van Gemert, Nijmegen (NL); Peter Drummen, Someren (NL)

(73) Assignee: NXP B.V., Eindhoven (NL)

(\*) Notice: Subject to any disclaimer, the term of this patent is extended or adjusted under 35 U.S.C. 154(b) by 0 days.

(21) Appl. No.: 16/030,006

(22) Filed: Jul. 9, 2018

(65) Prior Publication Data

US 2019/0011496 A1 Jan. 10, 2019

(30) Foreign Application Priority Data

Jul. 7, 2017 (EP) .................................. 17180372

(51) Int. Cl.
| | |
|---|---|
| *G01R 31/28* | (2006.01) |
| *H01L 23/58* | (2006.01) |
| *H01L 23/00* | (2006.01) |
| *H01L 21/66* | (2006.01) |
| *H01L 21/78* | (2006.01) |
| *H01L 23/31* | (2006.01) |

(Continued)

(52) U.S. Cl.
CPC ..... *G01R 31/2884* (2013.01); *G01R 31/2856* (2013.01); *H01L 21/78* (2013.01); *H01L 22/34* (2013.01); *H01L 23/3114* (2013.01); *H01L 23/528* (2013.01); *H01L 23/5226* (2013.01); *H01L 23/562* (2013.01); *H01L 23/585* (2013.01); *H01L 24/05* (2013.01); *H01L 2224/0401* (2013.01)

(58) Field of Classification Search
CPC ............ G01R 31/2884; G01R 31/2856; H01L 23/3114; H01L 24/05; H01L 23/528; H01L 21/78; H01L 23/5226; H01L 23/585; H01L 22/34; H01L 23/562; H01L 2224/0401
See application file for complete search history.

(56) References Cited

U.S. PATENT DOCUMENTS

| | | |
|---|---|---|
| 6,686,750 B2 | 2/2004 | Watanabe et al. |
| 8,436,352 B2 | 5/2013 | Kaneda et al. |

(Continued)

FOREIGN PATENT DOCUMENTS

| | | |
|---|---|---|
| JP | 05-235130 A | 9/1993 |
| JP | 07193108 A | 7/1995 |

(Continued)

*Primary Examiner* — Karen Kusumakar
(74) *Attorney, Agent, or Firm* — Rajeev Madnawat

(57) ABSTRACT

An apparatus comprising: a substrate; an integrated circuit region formed in the substrate; a seal ring disposed in the substrate to form a ring around the integrated circuit region, the seal ring configured to provide for protection against one or more of moisture ingress and ion ingress to the integrated circuit region and crack propagation through the substrate; and a defect sensor comprising a conductive track formed of at least one conductive layer in the substrate, the conductive track disposed outwardly of the seal ring and arranged to at least partially surround the integrated circuit region and seal ring, the conductive track having a first end terminal and a second end terminal to receive a detection signal therebetween to pass through the conductive track to detect a break in the conductive track and thereby a defect in the substrate.

15 Claims, 3 Drawing Sheets

(51) Int. Cl.
*H01L 23/522* (2006.01)
*H01L 23/528* (2006.01)

(56) References Cited

U.S. PATENT DOCUMENTS

| | | | |
|---|---|---|---|
| 8,497,695 | B2 | 7/2013 | Matoba et al. |
| 2007/0096092 | A1* | 5/2007 | Huang .................. H01L 23/585 257/48 |
| 2007/0257353 | A1 | 11/2007 | Park |
| 2007/0262370 | A1* | 11/2007 | Okada ..................... H01L 21/78 257/315 |
| 2009/0201043 | A1 | 8/2009 | Kaltalioglu |
| 2013/0009663 | A1 | 1/2013 | Gauch et al. |
| 2016/0300800 | A1 | 10/2016 | Zeng et al. |
| 2018/0138098 | A1 | 5/2018 | Schneider et al. |

FOREIGN PATENT DOCUMENTS

| | | |
|---|---|---|
| JP | 2000269431 A | 9/2000 |
| WO | 2016180756 A1 | 11/2016 |

\* cited by examiner

APPARATUS COMPRISING A SEMICONDUCTOR ARRANGEMENT

CROSS-REFERENCE TO RELATED APPLICATIONS

This application claims the priority under 35 U.S.C. § 119 of European Patent application no. 17180372.9, filed on Jul. 7, 2018, the contents of which are incorporated by reference herein.

The present disclosure relates to an apparatus comprising a substrate and an integrated circuit region and having a defect sensor there around to detect defects in the substrate. It also relates to an associated method of manufacture.

According to a first aspect of the present disclosure there is provided an apparatus comprising:

a substrate;
  an integrated circuit region formed in the substrate;
  a seal ring disposed in the substrate to form a ring around the integrated circuit region, the seal ring configured to provide for protection against one or more of moisture ingress and ion ingress to the integrated circuit region and crack propagation through the substrate; and
  a defect sensor comprising a conductive track formed of at least one conductive layer in the substrate, the conductive track disposed outwardly of the seal ring and arranged to at least partially surround the integrated circuit region and seal ring, the conductive track having a first end terminal and a second end terminal to receive a detection signal therebetween to pass through the conductive track to detect a break in the conductive track and thereby a defect in the substrate.

In one or more embodiments, the integrated circuit region includes a defect detection circuitry within the seal ring for providing the detection signal between the first end terminal and the second end terminal In one or more embodiments, the connection between the defect detection circuitry and the first end terminal and the second end terminal is provided by a redistribution layer.

In one or more embodiments, the redistribution layer comprises an arrangement of metal traces over the substrate that provide for routing over the integrated circuit region. In one or more examples, the redistribution layer provides for placement of solder bump pads over an active area of the integrated circuit region. In one or more examples, the redistribution layer is provided on top of a passivation layer of the integrated circuit region, the passivation layer typically of Silicon Oxide and/or Silicon Nitride. In one or more examples, the redistribution layer comprises a layer of metal, such as copper, traces and dielectric, such as an organic dielectric, which may be itself covered by a dielectric, such as a second organic dielectric.

In one or more embodiments, the redistribution layer comprises a layer provided on the substrate and having an arrangement of metal to:

(a) bridge the seal ring and connect the first end terminal and the second end terminal to the defect detection circuit; and
  (b) provide for connection of an input-output pad of the integrated circuit region to a bump pad, the bump pad and redistribution layer providing for connection of the input-output pad and therefore circuitry of the integrated circuit region to circuitry external to the apparatus.

In one or more embodiments, the defect sensor comprises a first defect sensor and the apparatus includes a second defect sensor, the second defect sensor comprising a second conductive track formed of at least one conductive layer in the substrate, the second conductive track disposed inwardly of the seal ring and arranged to at least partially surround a periphery of the integrated circuit region, the second conductive track having a second-track-first-end terminal and a second-track-second-end terminal to provide for passing of a detection signal through the second conductive track to detect a break in the second conductive track and thereby a defect in the substrate.

In one or more embodiments, the defect detection circuitry includes a switch arrangement to switch between providing the detection signal to the first defect sensor and providing the detection signal to the second defect sensor.

In one or more embodiments, the substrate comprises a wafer and a plurality of semiconductor arrangements each comprising at least the integrated circuit region, the seal ring and the defect sensor, are provided on said wafer for dicing into individual semiconductor arrangements.

In one or more embodiments, the semiconductor arrangements comprise a wafer level chip scale packages.

In one or more embodiments, the conductive track of the defect sensor comprises a plurality of metal layers arranged in different planes in the substrate, at least two of the metal layers connected to one another by a via.

According to a second aspect of the present disclosure there is provided a method of manufacturing an apparatus comprising:

providing, on a substrate having an integrated circuit region formed therein and a seal ring disposed in the substrate to form a ring around the integrated circuit region, the seal ring configured to provide for protection against one or more of moisture and ion ingress to the integrated circuit region, a defect sensor comprising a conductive track formed in at least one conductive layer in the substrate, the conductive track disposed outwardly of the seal ring and arranged to at least partially surround the integrated circuit region and seal ring, the conductive track having a first end terminal and a second end terminal to provide for passing of a detection signal through the conductive track to detect a break in the conductive track and thereby a defect in the substrate.

In one or more embodiments, the integrated circuit region includes a defect detection circuitry within the seal ring for providing the detection signal between the first end terminal and the second end terminal, the method comprising:

providing a connection between the defect detection circuitry and the first end terminal and the second end terminal by provision of a redistribution layer.

In one or more embodiments, the step of providing a connection comprises:

providing a redistribution layer on the substrate comprising an arrangement of metal to bridge and thereby extend over the seal ring and connect the first end terminal and the second end terminal to the defect detection circuit.

In one or more embodiments, the substrate comprises a wafer and a plurality of semiconductor arrangements each comprising at least the integrated circuit region and the seal ring are provided on said wafer, the step of providing a defect sensor comprising providing a defect sensor for at least one of the semiconductor arrangements.

In one or more embodiments, the method includes the step of dicing the wafer into individual semiconductor arrangements; and providing for application of the detection signal to the defect sensor of the at least one semiconductor arrangements to detect any defects outwardly of the seal ring that cause a break in the conductive track.

According to a third aspect of the present disclosure there is provided a semiconductor manufacturing device configured to perform the method of the second aspect.

While the disclosure is amenable to various modifications and alternative forms, specifics thereof have been shown by way of example in the drawings and will be described in detail.

It should be understood, however, that other embodiments, beyond the particular embodiments described, are possible as well. All modifications, equivalents; and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Figure 1:
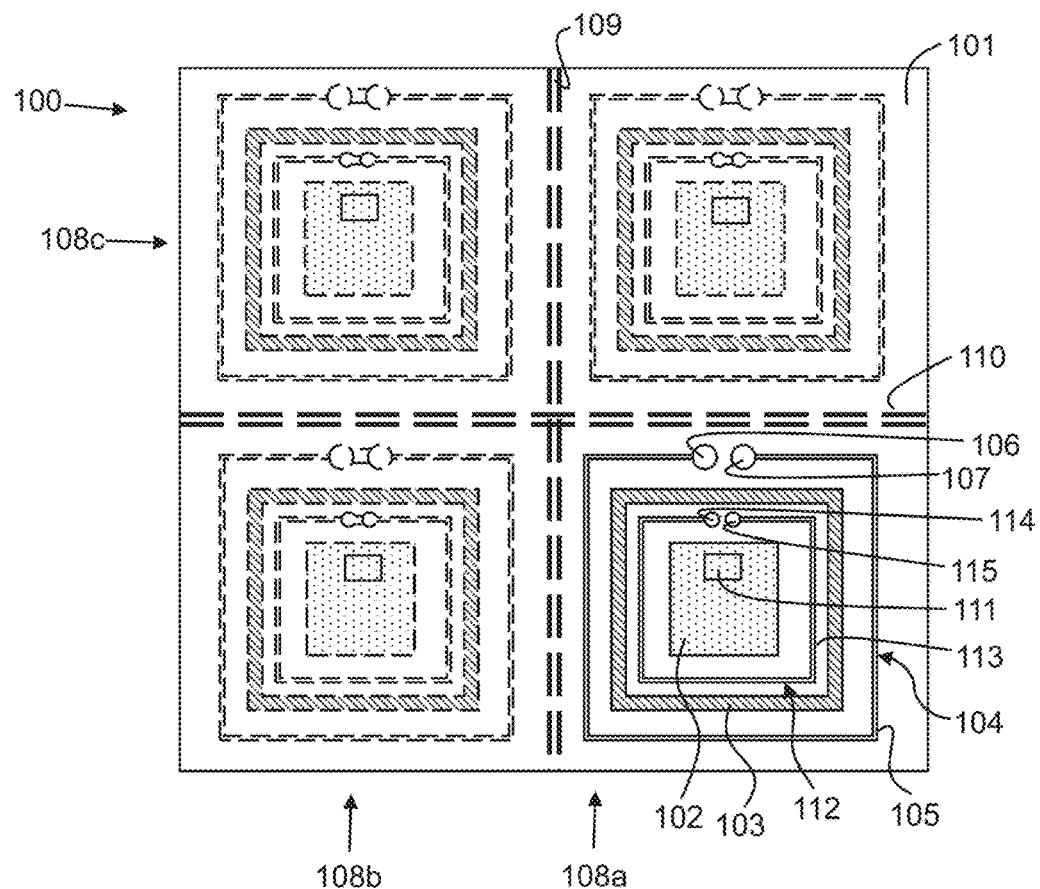
FIG. 1 shows an example embodiment of an apparatus comprising a plurality of integrated circuit arrangements on a common wafer.

During integrated circuit manufacture, integrated circuit components are formed on a substrate; termed a wafer. Typically, many individual integrated circuit arrangements are formed on the wafer. The wafer is then diced, such as by cutting or sawing, to form the individual integrated circuit arrangements. The integrated circuit arrangements may comprise dies or chip scale packages (CSP) depending on the type of integrated circuit being manufactured. During dicing of the wafer into separate dies or CSPs there is a small chance of chipping and/or crack formation due to dicing blade stress.

For non-CSP integrated circuit arrangements, in some examples, an electrical test may be done after this dicing or "singulation" step so that defects can be detected. A wafer-level package (WL)CSP is a package comprising an integrated circuit that was packaged while still part of the wafer, in contrast to the more conventional method of dicing the wafer into individual integrated circuit arrangements and then packaging them. For integrated circuit arrangements of Wafer-Level Chip Scale Package (WL)CSP type, it may be common for no electrical testing to be done after dicing. In some examples, only optical inspection is performed to identify potential defects.

Integrated circuit arrangements are typically provided with a seal ring that extends around the outer periphery of the integrated circuit arrangement. The seal ring is typically a continuous ring of one or more metal layers. In one or more examples, the metal layers are connected by vias, such as a ring of vias or continuous ring of vias. In one or more examples, the metal layers comprise one or more of Copper or Aluminium metallization and vias in the substrate configured to provide a hermetic seal between the outside environment and the dielectric layers of the integrated circuit formed in the semiconductor substrate. The seal ring may have one or more of the following functions: to provide for protection against moisture ingress to integrated circuit components formed in the substrate of the integrated circuit arrangement; to provide for protection against ion ingress to integrated circuit components formed in the substrate, and provide a structure to protect against the propagation of cracks in the substrate typically towards a region inwardly of the seal ring where the integrated circuit components are located.

In one or more examples, defect or "crack" detection circuits may be provided inwardly of the seal ring to be able to detect such potential cracks that have perhaps breached the seal ring and may have extended into the region of the integrated circuit components.

In the example embodiments that follow we disclose an apparatus configured to allow for the detection of defects, such as cracks in or chipping of the substrate, before those defects propagate through the substrate and reach the seal ring, and thereby potentially provide for better detection of potential issues and improved reliability in the final application.

FIG. 1 shows an apparatus 100 comprising a substrate 101. One or more integrated circuit components may be formed in a defined area in the substrate to form an integrated circuit region 102. The integrated circuit region may include any one or more of transistors, capacitors, inductors and resistors configured to perform a desired function.

In the example of FIG. 1, the apparatus 100 further comprises a seal ring 103 disposed in the substrate and configured to form a ring around the integrated circuit region 102. The seal ring may comprise a continuous ring structure around the integrated circuit region. The seal ring may be formed of a stack of wholly metal layers including vias therebetween. The seal ring 103 may be formed of one or multiple layers in the substrate. It will be appreciated that the integrated circuit components of the integrated circuit region may be formed of a plurality of layers in the substrate. One or more of the plurality of layers may comprise doped substrate material or have metal or other materials selectively deposited. The seal ring may be formed in said layers around the periphery of the integrated circuit region 102. The seal ring typically has a depth in the substrate substantially equivalent to or greater than the depth of the integrated circuit region 102.

The seal ring 103 may be configured to provide for protection against one or more of moisture; ion ingress to the integrated circuit region; crack or defect propagation through the substrate. Thus, the seal ring 103, being of a different material to the substrate, may provide a barrier against propagation of cracks towards the integrated circuit region. Nevertheless, cracks and other defects may, in some circumstances, breach the seal ring and thus impact on the functionality of the integrated circuit region 102.

The apparatus further comprises a defect sensor 104 comprising a conductive track 105 formed of at least one conductive layer in the substrate 101. The conductive track 105 is, in this example, disposed wholly outwardly of the seal ring 103 and arranged to surround the integrated circuit region 102 and seal ring 103. The conductive track may be of metal, such as copper or aluminium, and may extend over one or more layers in the substrate 101.

The conductive track 105 has a first end terminal 106 and a second end terminal 107 to provide for passing of a detection signal through the conductive track 105 to detect a break in the conductive track 105 and thereby a defect in the substrate 101.

In the example of FIG. 1, the substrate 101 comprises a semiconductor wafer. Accordingly, a plurality of individual semiconductor arrangements 108a, 108b, 108c and 108d are provided on the wafer. Each semiconductor arrangement comprises at least the integrated circuit region 102, the seal ring 103 and the defect sensor 104. In this example, the individual semiconductor arrangements 108a, 108b, 108c and 108d are the same but in other embodiments the integrated circuit regions 102 of the individual semiconductor arrangements could be different. In other embodiments, the substrate 101 may comprise a semiconductor die rather than a wafer and may therefore comprise a single integrated circuit arrangement 108a.

The semiconductor arrangements 108a, 108b, 108c and 108d are configured to be separated from the wafer 101 into individual element arrangements by dicing. Saw lanes 109 and 110 show where the substrate wafer 101 is to be cut to separate the individual semiconductor arrangements 108a, 108b, 108c and 108d. The saw lanes 109 and 110 may or may not be marked on the semiconductor wafer 101.

In the present example, the apparatus 100 is processed to form Wafer-Level Chip Scale Packages (WL)CSP that each include one of the integrated circuit arrangements 108a-d. Accordingly, the integrated circuit arrangements 108a-d, in this example, will undergo a packaging step prior to being diced from the wafer 101. In other examples, the integrated circuit arrangements 108a-d may be processed to form individual dies and then packaged and/or integrated with other apparatuses. In other examples, the integrated circuit arrangements 108a-d may be processed to form CSPs and may undergo a packaging step after being diced from the wafer 101.

In one or more examples, and as shown in FIG. 1, the integrated circuit region 102 may include a defect detection circuitry 111. The defect detection circuitry is, in this example, within the bounds of the seal ring 103 for providing the detection signal between the first end terminal 106 and the second end terminal 107. In this example, the defect detection circuitry 111 is part of the integrated circuit components that form the integrated circuit region 102, although it may be separate therefrom in other examples. The defect detection circuitry 111 may thus activate the defect sensor 104 by passing the detection signal therethrough. If the conductive track 105 is intact, then the detection signal applied to one of the first end terminal 106 and the second end terminal 107 will be received at the other terminal 106, 107. However, if there is a defect in the substrate that has caused the conductive track 105 to be broken, such as by a crack that has propagated through the conductive track 105, then the detection signal applied to one of the first end terminal 106 and the second end terminal 107 will not be received at the other terminal 106, 107. Thus, based on the success or failure of passing the detection signal between the first end terminal 106 and the second end terminal 107, the defect detection circuitry may be configured to determine the presence of a defect. Defective dies or packages determined by the defect detection circuitry 111 may be discarded, while non-defective dies or packages may proceed to further processing steps or complete their manufacturing process.

In other embodiments (not shown) the defect detection circuitry 111 may be external to the integrated circuit region 102. In other embodiments, the defect detection circuitry may be located off the substrate 101. For example, an external testing device may be used to apply the detection signal between the first end terminal 106 and the second end terminal 107.

In the example of FIG. 1, two defect sensors are provided, one outward of the seal ring 103 as described above and one inward of the seal ring 103. It will be appreciated that in other examples the apparatus 100 may include only one or more defect sensors disposed outward of the seal ring 103.

For ease of reference the defect sensor 104 may be termed the first defect sensor 104. A second defect sensor 112 is provided comprising a second conductive track 113 formed of at least one conductive layer in the substrate 101. The second conductive track 113 is disposed wholly inwardly of the seal ring and around a peripheral edge of the integrated circuit region 102. The second conductive track 113 has a second-track-first-end terminal 114 and a second-track-second-end terminal 115 to provide for passing of a detection signal through the second conductive track 113 to detect a break in the second conductive track and thereby a defect, such as a crack, in the substrate 101 that perhaps has breached the seal ring 103.

Accordingly, in terms of cracks in the substrate that may occur on dicing the substrate, the first defect sensor 104 may be configured to detect defects that may or may not have breached the seal ring 103 and the second defect sensor 104 is configured to detect defects that have breached the seal ring 103. Accordingly, based on cracks that propagate towards the integrated circuit region 102 from the edge of the integrated circuit arrangement, the first defect sensor 104 may provide a warning in relation to cracks that may not yet be affecting the operation of the integrated circuit region 102 (because the seal ring 103 is not breached). The second defect sensor 113 may provide a warning in relation to cracks that may affect the operation of the integrated circuit region 102 (because the seal ring 103 is breached). In breaching the seal ring 103 a crack may be considered more likely to continue to propagate towards the integrated circuit region thereby affecting its operation.

Figure 2:
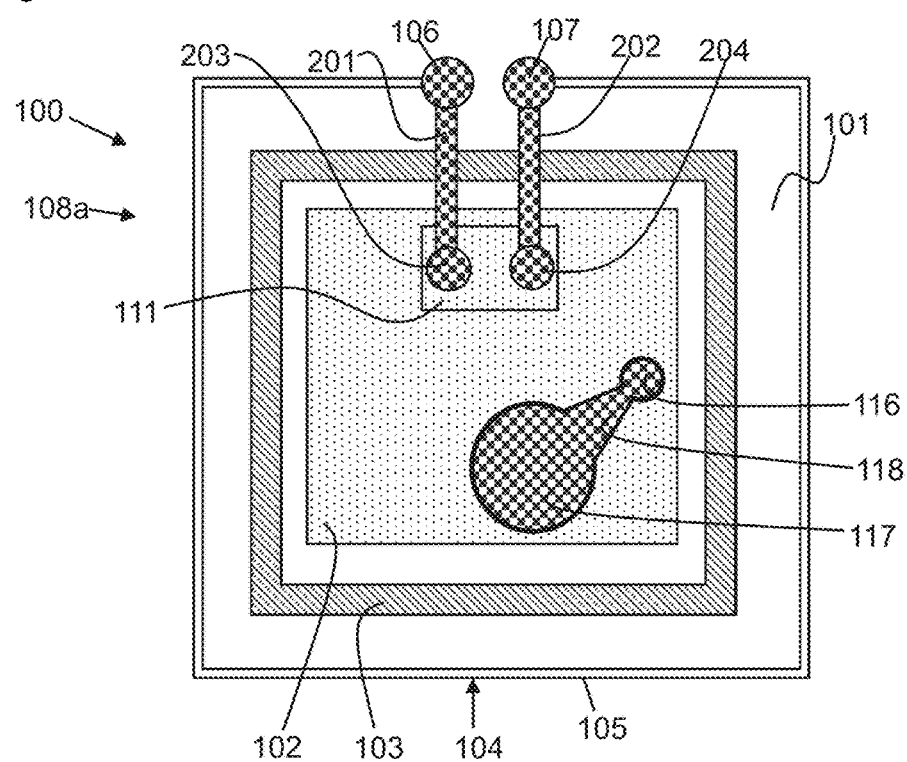
FIG. 2 shows an example embodiment of an apparatus comprising a single integrated circuit arrangement including a redistribution layer.

The example of FIG. 2 shows one of the integrated circuit arrangements 108a shown in FIG. 1. The second defect sensor 113 is not shown in FIG. 2 for simplicity.

FIG. 2 illustrates the connection between the first end terminal 106 and the second end terminal 107 and the defect detection circuitry 111. As mentioned above the seal ring 103 may provide for protection against one or more of moisture; ion ingress to the integrated circuit region; and crack or defect propagation through the substrate. Accordingly, the electrical connection between the defect detection circuitry 111 located within the seal ring 103 and the terminals 106; 107 located outside the seal ring should preferably not interfere with the functionality of the seal ring.

In one or more examples, the connection between the defect detection circuitry 111 and at least one of the first end terminal 106 and the second end terminal 107 is provided by a redistribution layer (shown with checked pattern in FIG. 2).

The redistribution layer may typically comprise the topmost layer of metal applied to a substrate 101. The redistribution layer may serve to provide for connection of an input-output pad 116 of the integrated circuit region 102 to a bump pad 117 via connecting section 118, the bump pad 117 and redistribution layer providing for connection of the input-output pad 116, and therefore circuitry of the integrated circuit region 102, to circuitry external to the semiconductor arrangement 108a. Thus; in general terms, the redistribution layer provides for repositioning of input-output pads of the integrated circuit region for connection to external circuitry. FIG. 2 also shows the bump pad comprising a solder balls for connection to the external circuitry. The connection between the defect detection circuitry 111 and at least one of the first end terminal 106 and the second end terminal 107 may advantageously be provided in this same metal layer in which the redistribution layer is formed. Thus, the connection that bridges the seal ring is provided in the same plane as the redistribution layer.

In one or more examples, the redistribution layer includes an arrangement of metal to provide a first bridge connector 201 and a second bridge connector 202. The first bridge connector 201 and a second bridge connector 202 bridge the seal ring to connect the defect sensor 104 to the defect detection circuitry 111. The first bridge connector 201 provides an electrical connection between the first end terminal 106 and a first terminal 203 of the defect detection circuitry 111. The second bridge connector 202 provides an electrical connection between the second end terminal 107 and a second terminal 204 of the defect detection circuitry 111.

The first and second terminals 203, 204 of the defect detection circuitry are, in this example, connected to integrated circuit components in the defect detection circuit 111 by the bridge connectors 201, 202 redistribution layer.

Figure 3:
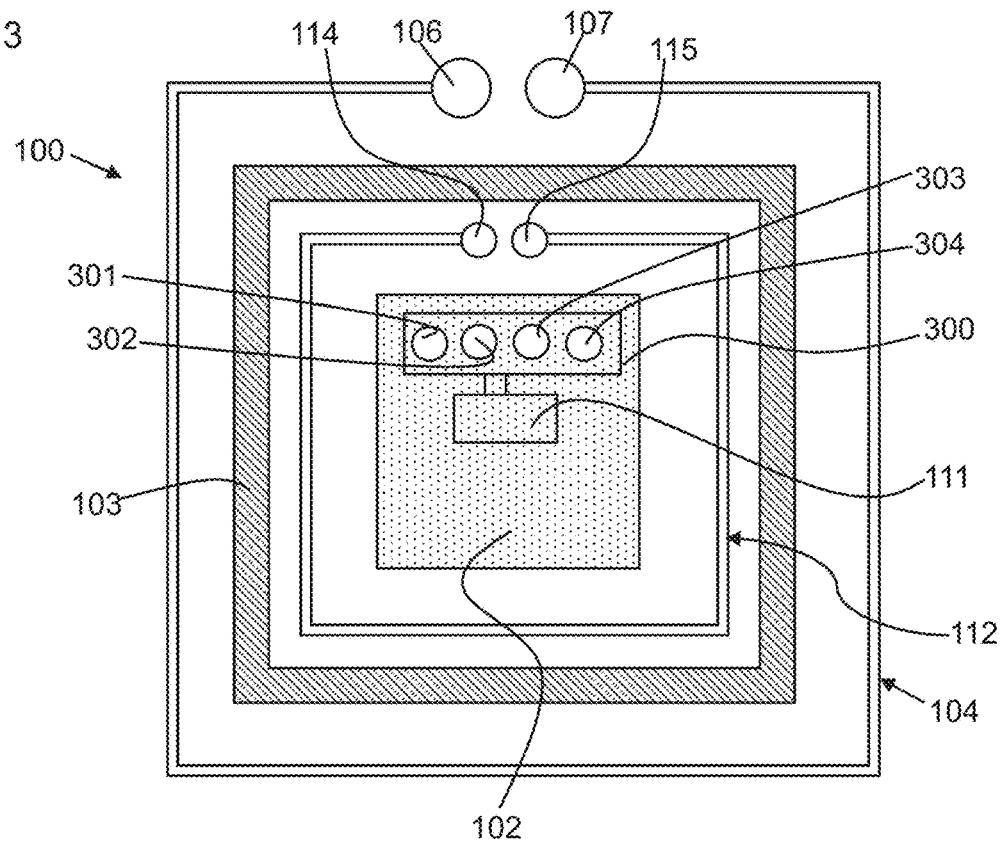
FIG. 3 shows an example embodiment of an apparatus comprising a single integrated circuit arrangement including a switch arrangement.

FIG. 3 shows an example similar to FIG. 2 except that the second defect sensor 112 is shown and the redistribution layer is hidden from view. In this example, the apparatus 100 is shown to include a switch arrangement 300. The switch arrangement 300 may form part of the defect detection circuitry 111. The switch arrangement 300 may be configured to switch between providing the detection signal to the first defect sensor 104 and providing the detection signal to the second defect sensor 112. The switch arrangement 300, in this example, includes four terminals 301, 302, 303, 304 configured to connect to the four terminals 106, 107, 114, 115 of the two defect sensors 104, 112, although other arrangements may be possible.

The switch arrangement 300 may comprise transistor based switches to connect the defect detection circuitry 111 to the first end terminal 106 and the second end terminal 107 or to the second-track-first-end terminal 114 and the second-track-second-end terminal 115. The defect detection circuitry 111 may provide for control of the switching arrangement 300.

Figure 4:
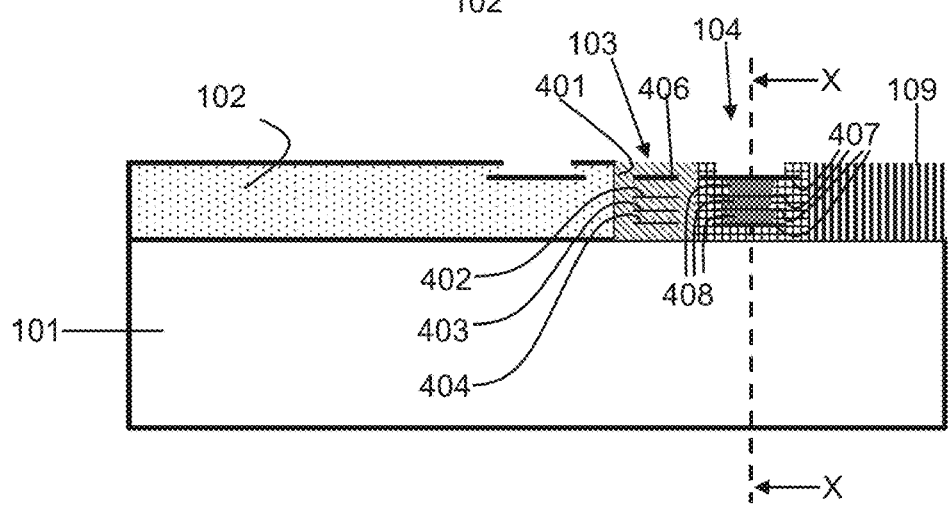
FIG. 4 shows an example cross-section view of the integrated circuit region, seal ring and defect sensor.
Figure 5:
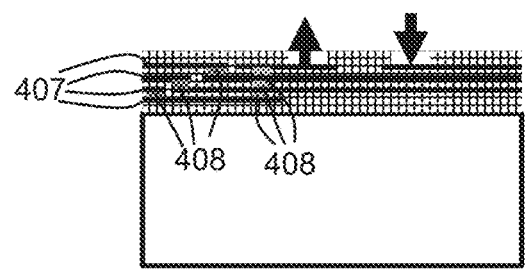
FIG. 5 shows an example cross-section view of the defect sensor illustrating a multi-layered conductive track with different arrangements of vias.

FIG. 4 shows a cross section through part of the substrate of FIG. 2 to illustrate an example of the structures formed therein. FIG. 5 shows a cross-section along the line X-X of FIG. 4. FIGS. 4 and 5 do not show the redistribution layer while FIG. 6, which is similar to FIG. 4 does. The same reference numerals have been used for like parts.

FIGS. 4 and 5 shows the seal ring 103 comprising a region 401 formed in the substrate 101 and comprising a plurality of metal layers 402, 403, 404 surrounded by dielectric material. The dielectric material may be a standard or low K dielectric material commonly used in semiconductor manufacture. The same dielectric material may be used as the total back end stack of the substrate. In one or more examples, one or more or all of the metal layers 402-404 are connected to each other with rings of vias comprising a single via or a plurality of individual vias arranged together. The layers and vias of the seal ring may extend from a bottom-most, contact layer to a topside passivation layer typically of Silicon Oxide Silicon Nitride 406.

The conductive track 105 of the defect sensor 104, in the example of FIG. 4 comprises a plurality of stacked metal layers 407, forming conductor spiral going down through all metal layers. which may be connected by vias 408 to come back to the top metal. The positioning of the vias 408 relative to the metal layers 407 is shown in FIG. 5. It will be appreciated that other structures to create a signal trace or track passing through a plurality of metal layers (or at least all the metal layers used in formation of the integrated circuit region 102) are possible.

On the left hand-side of FIG. 5 a first example shows the vias 408 at staggered positions i.e. non-vertically aligned relative to the layers 407. The right-hand side of FIG. 5 shows a second example in which the vias 408 between different pairs of layers are vertically aligned. The arrangement of vias between a multi-layered conductive track 105 may be of only the non-vertically aligned arrangement, only the vertically aligned arrangement or a combination of the two. The continuity of the any one of the plurality of layers between the end terminals 106, 107 may be continuous or discontinuous, although vias connecting the layers together may provide for a single continuous track 115 over the different layers.

Figure 6:
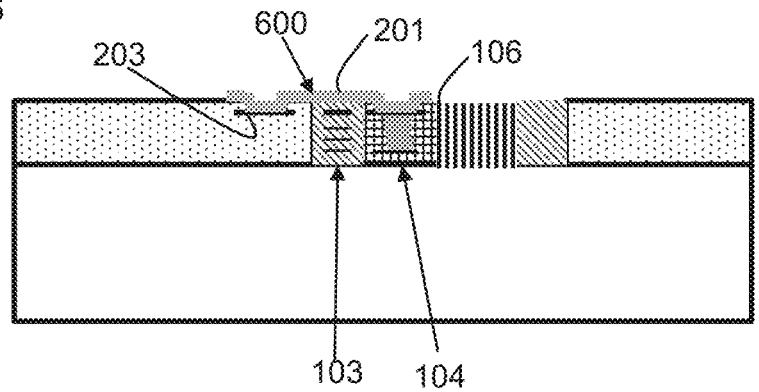
FIG. 6 shows an example cross-section view similar to FIG. 4 but including the redistribution layer.

FIG. 6 shows the presence of the redistribution layer 600. The redistribution layer bridges the seal ring 103 without an electrical connection thereto. The redistribution layer 600 thus electrically connects the first end terminal 106 to the first terminal 203 by way of the first bridge connector 201. The redistribution layer 600, in this example, comprises the top-most layer of metal on the substrate 101.

Figure 7:
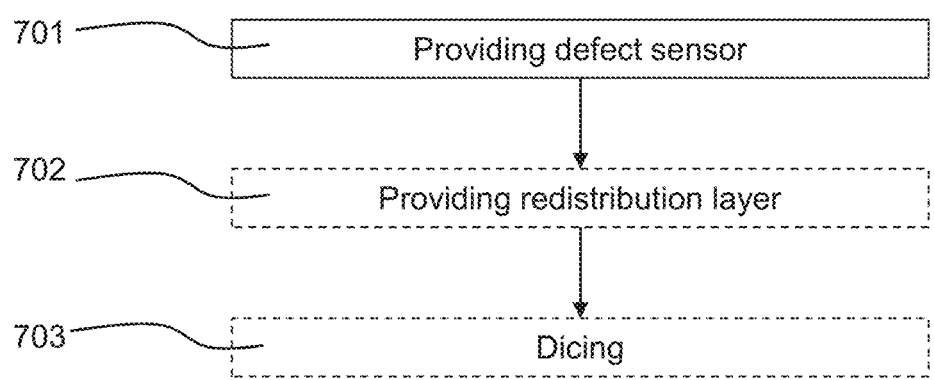
FIG. 7 shows an example flowchart illustrating a method of manufacturing an apparatus comprising a defect sensor.

FIG. 7 shows a flow chart illustrating the method of manufacturing an apparatus comprising the step of providing 701, on a substrate having an integrated circuit region formed therein and a seal ring disposed in the substrate to form a ring around the integrated circuit region, the seal ring configured to provide for protection against one or more of moisture and ion ingress to the integrated circuit region, a defect sensor comprising a conductive track formed in at least one conductive layer in the substrate, the conductive track disposed outwardly of the seal ring and arranged to at least partially surround the integrated circuit region and seal ring, the conductive track having a first end terminal and a second end terminal to provide for passing of a detection signal through the conductive track to detect a break in the conductive track and thereby a defect in the substrate.

The method further comprises providing 702 a connection between defect detection circuitry and the first end terminal and the second end terminal by provision of a redistribution layer, the defect detection circuitry provided within the seal ring for providing the detection signal between the first end terminal and the second end terminal.

The step 702 may comprise providing a layer on the substrate comprising an arrangement of metal to bridge, by way of the bridge connectors 201, 202, the seal ring 103 and connect the first end terminal 106 and the second end terminal 107 to the defect detection circuit 111.

The method may include the step of dicing 703 the wafer into individual semiconductor arrangements; and providing for application of the detection signal to the defect sensor of the at least one semiconductor arrangements to detect any defects outwardly of the seal ring that cause a break in the conductive track.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices; which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus comprising:
a substrate;
an integrated circuit region formed in the substrate;
a seal ring disposed in the substrate to form a ring around the integrated circuit region, the seal ring configured to provide for protection against one or more of moisture ingress and ion ingress to the integrated circuit region and crack propagation through the substrate; and
a defect sensor comprising a conductive track formed of at least one conductive layer in the substrate, the conductive track disposed outwardly of the seal ring and arranged to at least partially surround the integrated circuit region and seal ring, the conductive track having a first end terminal and a second end terminal to receive a detection signal therebetween to pass through the conductive track to detect a break in the conductive track and thereby a defect in the substrate; and
an internal defect sensor comprising a conductive track, the conductive track of the internal defect sensor is disposed inwardly of the seal ring and arranged to at least partially surround the integrated circuit, wherein the defect sensor and the internal defect sensor are coupled to a defect detection circuit via a switch.

2. The apparatus of claim 1, wherein the integrated circuit region includes a defect detection circuitry within the seal ring for providing the detection signal between the first end terminal and the second end terminal.

3. The apparatus of claim 2, wherein the connection between the defect detection circuitry and the first end terminal and the second end terminal is provided by a redistribution layer.

4. The apparatus of claim 3, wherein the redistribution layer comprises a layer provided on the substrate and having an arrangement of metal to:
bridge the seal ring and connect the first end terminal and the second end terminal to the defect detection circuit; and
provide for connection of an input-output pad of the integrated circuit region to a bump pad, the bump pad and redistribution layer providing for connection of the input-output pad and therefore circuitry of the integrated circuit region to circuitry external to the apparatus.

5. The apparatus of claim 2, wherein the defect sensor comprises a first defect sensor and the apparatus includes a second defect sensor, the second defect sensor comprising a second conductive track formed of at least one conductive layer in the substrate, the second conductive track disposed inwardly of the seal ring and arranged to at least partially surround a periphery of the integrated circuit region, the second conductive track having a second-track-first-end terminal and a second-track-second-end terminal to provide for passing of a detection signal through the second conductive track to detect a break in the second conductive track and thereby a defect in the substrate.

6. The apparatus of claim 5, wherein the defect detection circuitry includes a switch arrangement to switch between providing the detection signal to the first defect sensor and providing the detection signal to the second defect sensor.

7. The apparatus of claim 1, wherein the substrate comprises a wafer and a plurality of semiconductor arrangements each comprising at least the integrated circuit region, the seal ring and the defect sensor, are provided on said wafer for dicing into individual semiconductor arrangements.

8. The apparatus of claim 7, wherein the semiconductor arrangements comprise a wafer level chip scale packages.

9. The apparatus of claim 1, in which the conductive track of the defect sensor comprises a plurality of metal layers arranged in different planes in the substrate, at least two of the metal layers connected to one another by a via.

10. A method of manufacturing an apparatus comprising:
providing, on a substrate having an integrated circuit region formed therein and a seal ring disposed in the substrate to form a ring around the integrated circuit region, the seal ring configured to provide for protection against one or more of moisture and ion ingress to the integrated circuit region, a defect sensor comprising a conductive track formed in at least one conductive layer in the substrate, the conductive track disposed outwardly of the seal ring and arranged to at least partially surround the integrated circuit region and seal ring, the conductive track having a first end terminal and a second end terminal to provide for passing of a detection signal through the conductive track to detect a break in the conductive track and thereby a defect in the substrate; and providing an internal defect sensor comprising a conductive track, the conductive track of the internal defect sensor is disposed inwardly of the seal ring and arranged to at least partially surround the integrated circuit, wherein the defect sensor and the internal defect sensor are coupled to a defect detection circuit via a switch.

11. The method of claim 10, wherein the integrated circuit region includes a defect detection circuitry within the seal ring for providing the detection signal between the first end terminal and the second end terminal, the method comprising:

providing a connection between the defect detection circuitry and the first end terminal and the second end terminal by provision of a redistribution layer.

12. The method of claim 11, wherein the step of providing a connection comprises:

providing a redistribution layer on the substrate comprising an arrangement of metal to bridge and thereby extend over the seal ring and connect the first end terminal and the second end terminal to the defect detection circuit.

13. The method of claim 10, wherein the substrate comprises a wafer and a plurality of semiconductor arrangements each comprising at least the integrated circuit region and the seal ring are provided on said wafer, the step of providing a defect sensor comprising providing a defect sensor for at least one of the semiconductor arrangements.

14. The method of claim 13, wherein the method includes the step of dicing the wafer into individual semiconductor arrangements; and providing for application of the detection signal to the defect sensor of the at least one semiconductor arrangements to detect any defects outwardly of the seal ring that cause a break in the conductive track.

15. A semiconductor manufacturing device configured to perform the method of claim 10.

* * * * *